US008365029B2

(12) United States Patent
von Wendorff

(10) Patent No.: US 8,365,029 B2
(45) Date of Patent: Jan. 29, 2013

(54) DIGITAL CIRCUITS AND METHODS FOR TESTING A DIGITAL CIRCUIT

(75) Inventor: Wilhard von Wendorff, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1346 days.

(21) Appl. No.: 11/964,465

(22) Filed: Dec. 26, 2007

(65) Prior Publication Data
US 2009/0172282 A1    Jul. 2, 2009

(51) Int. Cl.
*G01R 31/28* (2006.01)
(52) U.S. Cl. .................................................. 714/726
(58) Field of Classification Search .................. 714/726, 714/727, 729
See application file for complete search history.

(56) References Cited

U.S. PATENT DOCUMENTS

| | | | | | |
|---|---|---|---|---|---|
| 4,995,039 | A | * | 2/1991 | Sakashita et al. | 714/731 |
| 5,398,250 | A | * | 3/1995 | Nozuyama | 714/726 |
| 5,694,402 | A | * | 12/1997 | Butler et al. | 714/732 |
| 5,894,482 | A | * | 4/1999 | Motohara | 714/733 |
| 6,738,939 | B2 | * | 5/2004 | Udawatta et al. | 714/726 |
| 6,877,119 | B2 | * | 4/2005 | Lauga | 714/726 |
| 6,990,618 | B1 | * | 1/2006 | Lulla et al. | 714/727 |
| 7,290,190 | B2 | * | 10/2007 | Obara | 714/726 |
| 7,373,568 | B1 | * | 5/2008 | Horovitz | 714/726 |
| 7,418,641 | B2 | * | 8/2008 | Drake et al. | 714/726 |
| 7,428,678 | B1 | * | 9/2008 | Berndt et al. | 714/729 |
| 7,716,545 | B2 | * | 5/2010 | Shimooka | 714/726 |
| 7,739,568 | B1 | * | 6/2010 | Bertanzetti | 714/729 |
| 2007/0101108 | A1 | | 5/2007 | Grossman et al. | |

FOREIGN PATENT DOCUMENTS

DE         10033349 A1     1/2002

OTHER PUBLICATIONS

Texas Instruments SDLS128 "4-Bit Parallel-Access Shift Registers" Mar. 1974, revised Mar. 1988 (pp. 1-13).

* cited by examiner

*Primary Examiner* — James C Kerveros
(74) *Attorney, Agent, or Firm* — Dicke, Billig & Czaja, PLLC

(57) ABSTRACT

Digital circuits and methods for testing a digital circuit are disclosed. One embodiment provides a digital circuit having a first plurality of storage elements, and a second plurality of storage elements. The digital circuit is operable in a first operation mode and in a second operation mode. In the first operation mode, the storage elements of the first plurality of storage elements operate according to their intended use within the digital circuit and the storage elements of the second plurality of storage elements are connected in series. In the second operation mode, the first plurality of storage elements is connected to the second plurality of storage elements to allow data exchange between the first plurality of storage elements and the second plurality of storage elements.

12 Claims, 5 Drawing Sheets

DIGITAL CIRCUITS AND METHODS FOR TESTING A DIGITAL CIRCUIT

BACKGROUND

The invention relates to digital circuits and methods for testing a digital circuit.

It is often required to repeatedly verify correct operation of digital circuits, for example, microprocessors or microcontrollers. Especially in the field of automobiles it is vital to ensure correct operation of microprocessors or microcontrollers in control devices.

Known methods for testing functionality of a microprocessor in a control device, or more precisely of a core or central processing unit (CPU) of the processor, are for example, based on redundant systems. For this purpose two processors are provided with similar computing power. On both processors a respective control algorithm is executed. The results and sometimes also intermediate results are compared, for example, before activating respective output signals. If the results differ significantly an error in one of the two processors is assumed and the entire system is put into a "Fail Safe" state, for example, the system is shut down, to avoid incorrect controlling. However, as the control of the processor is performed during normal operation, errors which may lead to a shut down of the control system are first detected when the car is moved which may lead to dangerous situations for the driver.

Another approach for testing a CPU is to integrate a self test in the CPU, the so called built-in self test (BIST). The BIST requires dedicated circuitry to perform the self test of the processor. This, however, involves the necessity to ensure a complete error decoupling, which means that it has to be guaranteed that one single error does not change normal function of both the CPU and the self test logic. Thus, implementing a BIST functionality in a processor involves an increase in costs for development, design, and production.

An even further approach is the scan test for testing internal circuits in a processor. Similar to the BIST, the processors to be tested by a scan test have to be specially designed, that is, certain testability features have to be added to a microelectronic hardware product design to enable such tests. Accordingly, these design techniques are also called "Design for Test". In scan-design, all storage elements (for example, registers, flip-flops or latches) include two operation modes. In the first mode, the storage elements operate according to their intended use in the digital circuit and, in the second mode, all storage elements are connected into a long shift-register (scan chain) which is used to gain access to internal nodes of the digital circuit. In general, some storage elements of the scan chain are connected to input pins to provide test data to the serial chain of storage elements and some storage elements of the scan chain are connected to output pins to allow for the processed test data to be read out.

However, when testing the digital circuit during normal operation of the circuit, two problems arise.

First, the state of the circuit after the test will differ from the state of the circuit before the test since test data has been input in the scan chain and processed in the circuit.

Second, during the scan test which requires a certain time, the circuit can not fulfil its intended function. For long scan chains the required time is particularly long as shifting the test data or test patterns in all the serial connected memory elements of the chain requires as many clocks as the number of memory elements contained in the chain is.

One approach to address the second problem is to divide a long sequential scan chain into several shorter partial scan chains. However one input/output pin pair has to be provided for every partial chain. In addition to the high number of required pins, the clock frequency for in-/output of data via external pins is generally significantly lower that the one for transmitting data within integrated elements.

Therefore, there exists a need for a design for a digital circuit and a method for testing a digital circuit, which, on the one hand, is cost-efficient (and therefore not limited to high priced special applications) and, on the other hand, provides a reliable test of a digital circuit during operation without interfering proper operation of the circuit and with minimal interruption of normal operation of the circuit.

SUMMARY

In accordance with one embodiment, there is provided a digital circuit, including a first plurality of storage elements, and a second plurality of storage elements, the digital circuit being operable in a first operation mode and in a second operation mode, wherein, in the first operation mode, the storage elements of the first plurality of storage elements operate according to their intended use within the digital circuit and the storage elements of the second plurality of storage elements are connected in series, and wherein, in the second operation mode, the first plurality of storage elements is connected to the second plurality of storage elements to allow data exchange between the first plurality of storage elements and the second plurality of storage elements.

In accordance with a further embodiment, there is provided a method for testing a digital circuit, wherein the circuit includes a first plurality of storage elements and a second plurality of storage elements. The method includes providing a first operation mode, in which test data is loaded into the second plurality of storage elements and in which the first plurality of storage elements is operated according to its intended use in the digital circuit. Further, a second operation mode providing, in which data contents of the first plurality of storage elements are exchanged with data contents of the second plurality of storage elements.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
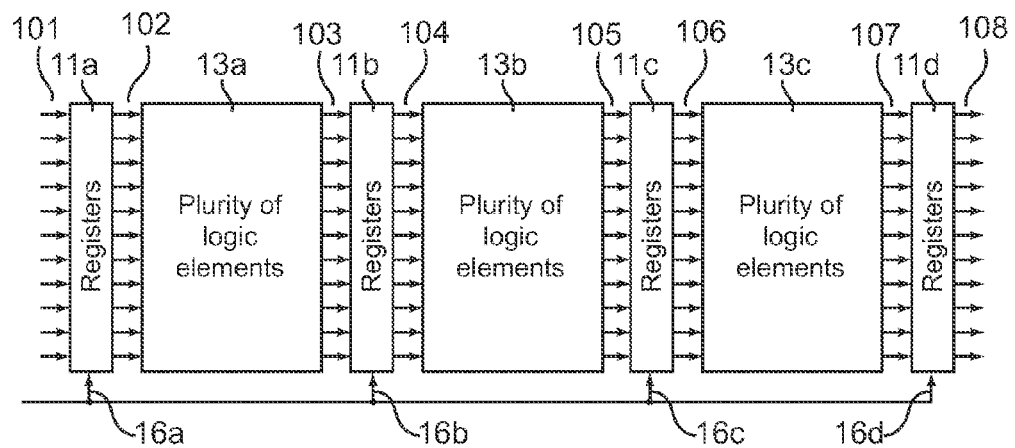
FIG. 1a illustrates a simplified schematic diagram of an example for a conventional digital circuit.

FIG. 1a illustrates a simplified schematic diagram of an example for a conventional digital circuit.

The illustrated circuit includes a first plurality of registers 11a, a second plurality of registers 11b, a third plurality of registers 11c, a fourth plurality of registers 11d, a first plurality of logic elements 13a, a second plurality of logic elements 13b, and a third plurality of logic elements 13c. The first plurality 11a of registers receives a plurality of input signals over connections 101 wherein each register of the first plurality of registers 11a receives one input signal.

The first plurality of registers 11a are connected, via connections 102 to the first plurality of logic elements 13a which receive the input signals from the first plurality of registers 11a, process the signals and forward the processed signals to the second plurality of registers 11b via connections 103. The second plurality of registers 11b provides these signals over connections 104 to the second plurality of logic elements 13b which processes the received signals and forwards the processed signals over connection 105 to the third plurality of registers 11c. The third plurality of registers 11c provides these signals over connections 106 to the third plurality of logic elements 13c which processes the received signals and forwards the processed signals over connection 107 to the fourth plurality of registers 11d. The fourth plurality of registers 11d outputs the received signals over connection 108. The first, second, third, and fourth plurality of registers 11a, 11b, 11c, 11d receive a clock signal over connections 16a, 16b, 16c and 16d, respectively.

Figure 1B:
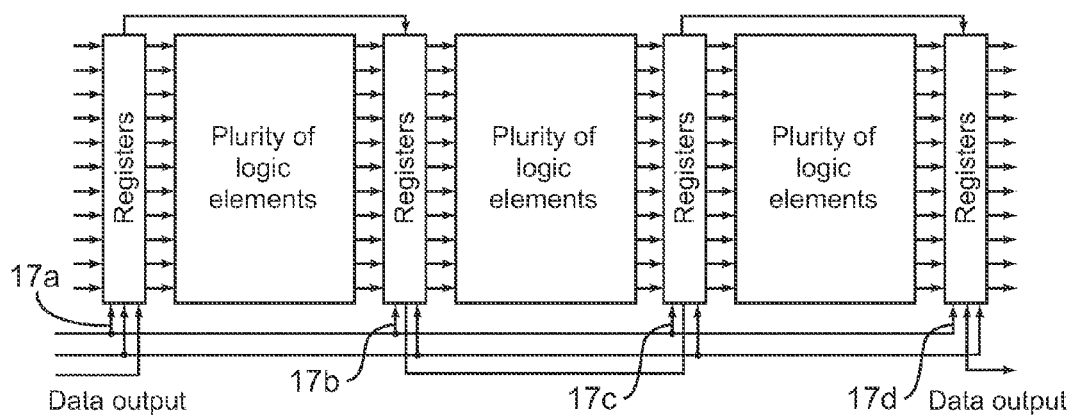
FIG. 1b illustrates a simplified schematic diagram of an example for a conventional digital circuit with scan test capability.

FIG. 1b illustrates a digital circuit which is based on the circuit of FIG. 1a, but further includes a conventional scan test functionality. To implement the scan test functionality the first, second, third, and fourth plurality of registers 11a, 11b, 11c, 11d can be operated in two different operation modes, a first operation mode which is a "normal" operation mode and a second operation mode which is a test mode.

For this purpose, a control signal is provided to the first, second, third, and fourth plurality of registers 11a, 11b, 11c, 11d over connections 17a, 17b, 17c and 17d, respectively, to enable or disable the test mode.

In the normal operation mode, the registers operate according to their intended functionality within the digital circuit, whereas in the test mode, all registers are sequentially connected to one scan chain, that is, the registers within each of the pluralities of registers 11a, 11b, 11c, 11d are sequentially connected and also the pluralities of registers 11a, 11b, 11c, 11d are sequentially connected to form a scan chain.

To perform a scan test the control signal is enabled to cause the registers to operate in the test mode, for example the control signal is switched from a "0" representing the normal operation mode to a "1" representing the test mode.

Then, test vectors or other suitable test data are input to the first register of the scan chain via a scan input and are then sequentially forwarded from one register to the next register in the scan chain. Therefore, it takes one clock for each serial register to shift out and shift in a single test vector element in all registers of the scan chain.

Then, the control signal is disabled to cause the registers to operate in the normal operation mode, for example the control signal is switched from a "1" to a "0". For one or more clocks the test vectors are processed propagating through the pluralities of logic elements 13a, 13b, 13c before the control signal is enabled again to cause the registers to operate in the test mode.

Now, the processed test vectors are shifted out of the registers, that is, are output from the last register of the scan chain via a data output by sequentially forwarding them through the registers of the serial scan chain. Therefore, it takes one clock for each serial register to shift and output the test vectors from all registers of the scan chain.

Thus, as an example, carrying out the scan test requires at least 201 clocks for a scan chain of 100 serial registers (100 clocks to input the test vectors in the serial registers, at least one clock for propagating the test vectors through the plurality of logic elements, and 100 clocks to output the test vectors from the serial registers). Since during this rather long time period the digital circuit can not fulfill its intended function and additionally, the former state of the circuit is lost, this conventional scan test is only used as a manufacturing test by now.

Figure 2:
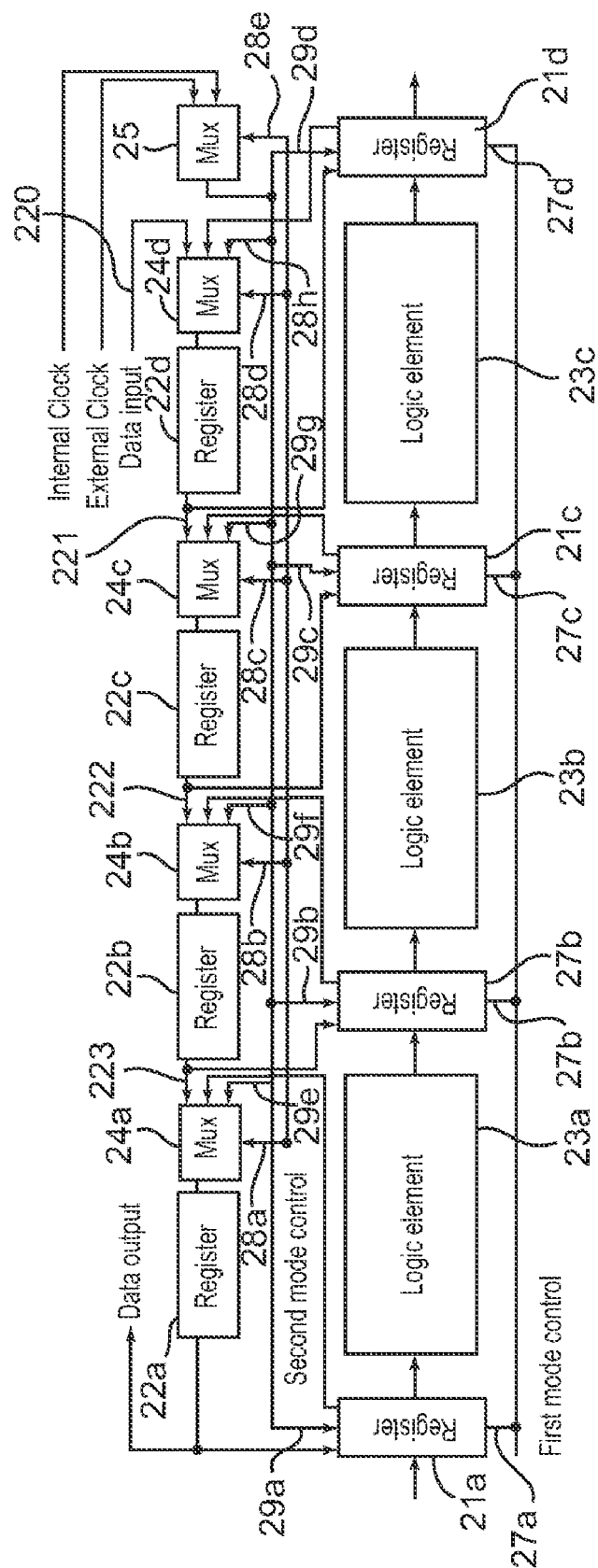
FIG. 2 illustrates an exemplary schematic diagram of a digital circuit according to one embodiment.

FIG. 2 illustrates an exemplary schematic diagram of a section of a digital circuit according to an embodiment of the invention.

For reasons of simplicity only a small section of a digital circuit, that is, only very few registers, are pictured in FIG. 2. The illustrated section of a digital circuit includes a first plurality or set of storage elements 21a, 21b, 21c, 21d and a plurality of logic elements 23a, 23b, 23c. In the illustrated embodiment, the storage elements 21a, 21b, 21c, 21d are registers. However, the invention is not limited to registers, but storage elements of any type may be used.

The storage elements 21a, 21b, 21c, 21d and the logic elements are connectable in an alternating succession: Register 21a is connected with logic element 23a which is further connected with register 21b which is, in turn, further connected with logic element 23b which is, in turn, further connected with register 21c which is, in turn, further connected with logic element 23c which is, in turn, further connected with register 21d.

The circuit of FIG. 2 further includes a second plurality or set of storage elements 22a, 22b, 22c, 22d and a plurality or set of multiplexers 24a, 24b, 24c, 24d each of which is connected to a storage element of the second set of storage elements. In the illustrated embodiment, the storage elements 22a, 22b, 22c, 22d are registers. However, the invention is not limited to registers, but storage elements of any type may be used.

Additionally, a single multiplexer 25 is provided which receives two different clock signals, an internal clock and an external clock.

Similar to the circuit of FIG. 1b, also in the circuit of FIG. 2, the first set of registers 21a, 21b, 21c, 21d can be operated in two different operation modes, a first operation mode which is a "normal" operation mode and a second operation mode which is a test mode.

Accordingly, a first mode control signal is provided to each register of the first set of registers 21a, 21b, 21c, 21d via connections 27a, 27b, 27c, 27d to specify the operation mode for the first set of registers 21a, 21b, 21c, 21d. For example, the test mode may be represented by a "1" and the normal operation mode by a "0" comprised in the first mode control signal or vice versa, but other ways of indicating/controlling the operation mode are also possible.

In the normal operation mode, the first set of registers 21a, 21b, 21c, 21d operates according to their intended functionality within the digital circuit, whereas in the test mode, each of the first set of registers 21a, 21b, 21c, 21d is disconnected from the logic elements 23a, 23b, 23c of the circuit and connected to a corresponding register of the second plurality of registers 22a, 22b, 22c, 22d.

Also the second set of registers 22a, 22b, 22c, 22d can be operated in a first operation mode and a second operation mode.

Accordingly, a second mode control signal is provided to each register of the second set of registers 22a, 22b, 22c, 22d via connections 28a, 28b, 28c, 28d to specify the operation mode for the second set of registers. For example, the second operation mode may be represented by a "1" and the first operation mode by a "0" comprised in the second mode control signal or vice versa, but other ways of indicating/controlling the operation mode are also possible.

Additionally, the second control mode signal is further provided, via connection 28e, to the additional single multiplexer 25 to select one of the clocks, internal and external, respectively, at the inputs of the additional single multiplexer 25. The selected clock signal is provided to the first set of registers 21a, 21b, 21c, 21d via connections 29a, 29b, 29c, 29d and to the set of multiplexers 24a, 24b, 24c, 24d via connections 29e, 29f, 29g, 29h. The selected clock signal is the clock with which data may be transferred into the second plurality of registers 22a, 22b, 22c, 22d. This may be a rather slow clock, if the respective data is stored externally to the circuit and has, for example, to be introduced via respective pads, or it may be a fast clock if the respective data is stored within the digital circuit.

In the beginning of a test of the digital circuit of FIG. 2, test data, for example, test vectors, are loaded into the second set of registers 22a, 22b, 22c, 22d. For this purpose, the second set of registers 22a, 22b, 22c, 22d or rather the set of multiplexers 24a, 24b, 24c, 24d are operated in the first operation mode (the second mode control signal includes, for example, a "0").

In the first operation mode, each of the set of multiplexers 24a, 24b, 24c, 24d forwards data received at its first input to its connected register of the second set of registers 22a, 22b, 22c, 22d.

A first multiplexer 24d of the set of multiplexers 24a, 24b, 24c, 24d has its first input connected to a scan data input via connection 220 for receiving the test data or test vectors, respectively.

All other multiplexers of the set of multiplexers 24a, 24b, 24c, 24d have their first inputs connected to an output of a "proceeding" register of the second set of registers 22a, 22b, 22c, 22d. In other words, the first input of multiplexer 24c is connected to the output of register 22d via connection 221, the first input of multiplexer 24b is connected to the output of register 22c via connection 222, and the first input of multiplexer 24a is connected to the output of register 22b via connection 223.

The "quasi" last register 22a (which has its output not connected with a first input of a "succeeding" multiplexer) has its output connected with a data output via connection 224 for outputting data resulting from the test of the circuit.

Thus, when operating in the first operation mode, the second set of registers 22a, 22b, 22c, 22d form a sequential scan chain, or, effectively, a shift register, into/from which the test vectors can be sequentially loaded and read out, respectively.

During the process of loading the test vectors into the second set of registers 22a, 22b, 22c, 22d the first set of registers 21a, 21b, 21c, 21d are operated in the normal operation mode and, therefore, normal operation of the digital circuit is not interrupted.

The above process of loading the test vectors having been completed, the set of multiplexers 24a, 24b, 24c, 24d connected to the second set of registers 22a, 22b, 22c, 22d receive an appropriate second modus control signal (for example, "1") causing them to switch to the second operation mode. Also the first set of registers 21a, 21b, 21c, 21d switch to the test mode having received an appropriate first modus control signal (for example, "1").

In the second operation mode, each of the set of multiplexers 24a, 24b, 24c, 24d forwards data received at its second input to its connected register of the second set of registers 22a, 22b, 22c, 22d.

In the test mode, each of the first set of registers 21a, 21b, 21c, 21d is disconnected from the logic elements 23a, 23b, 23c of the circuit and connected to a corresponding register of the second plurality of registers 22a, 22b, 22c, 22d.

For a better understanding of further operation of the circuit, one pair of registers consisting of one register 21d of the first set of registers and one register 22d of the second set of registers are considered in the following.

In this exemplary register pair, an output of register 21d is connected with an input of the register 22d via multiplexer 24d and an output of register 22d is connected to an input of register 21d which allows an exchange of data contents buffered in the registers 21d and 22d. Accordingly, the test data or test vector is transferred from register 22d to register 21d and the former content of register 21d is transferred to register 22d.

In the other register pairs which also include one register of the first set of registers 21a, 21b, 21c, 21d and a corresponding register of the second set of registers 22a, 22b, 22c, 22d, data transfer takes place in an analogous way.

Thus, the actual state of the circuit is preserved in the second set of registers 22a, 22b, 22c, 22d and the test vectors are loaded into the first set of registers 21a, 21b, 21c, 21d requiring a minimum of time as the test vectors are loaded parallelly. By contrast, in conventional systems as illustrated in FIG. 1b, the actual state of the system is lost, when loading the test vectors into the registers and the process of loading requires significantly more time since the test vectors are loaded sequentially into the registers.

Then, the first set of registers 21a, 21b, 21c, 21d are caused to switch to the first operation mode by an appropriate first mode control signal (for example, "0") to let the test vectors propagate through the logic elements for at least one clock.

Thereupon, the first set of registers 21a, 21b, 21c, 21d are caused to switch back to the second operation mode by an appropriate first mode control signal (for example, "1") to allow a reexchange of data between respective pairs of registers from the first and second set of registers, that is, the processed test vectors are transferred from the first set of registers 21a, 21b, 21c, 21d to the second set of registers 22a, 22b, 22c, 22d and the data contents of the second set of registers 22a, 22b, 22c, 22d are retransferred to the first set of registers 21a, 21b, 21c, 21d to reestablish the state in which the circuit was before the test.

Thereafter, the first set of registers 21a, 21b, 21c, 21d is caused to switch back to the normal operation mode by an appropriate first mode control signal (for example, "0") to allow continuing normal operation of the circuit.

At the same time, the set of multiplexers 24a, 24b, 24c, 24d connected to the second set of registers 22a, 22b, 22c, 22d receive an appropriate second mode control signal (for example, "0") causing them to switch to the first operation mode. In the first operation mode, the first inputs of the multiplexers are activated, so that the second set of registers 22a, 22b, 22c, 22d form effectively one shift register, from which the test results, that is, the processed test vectors, are sequentially output to the scan output.

Figure 3:
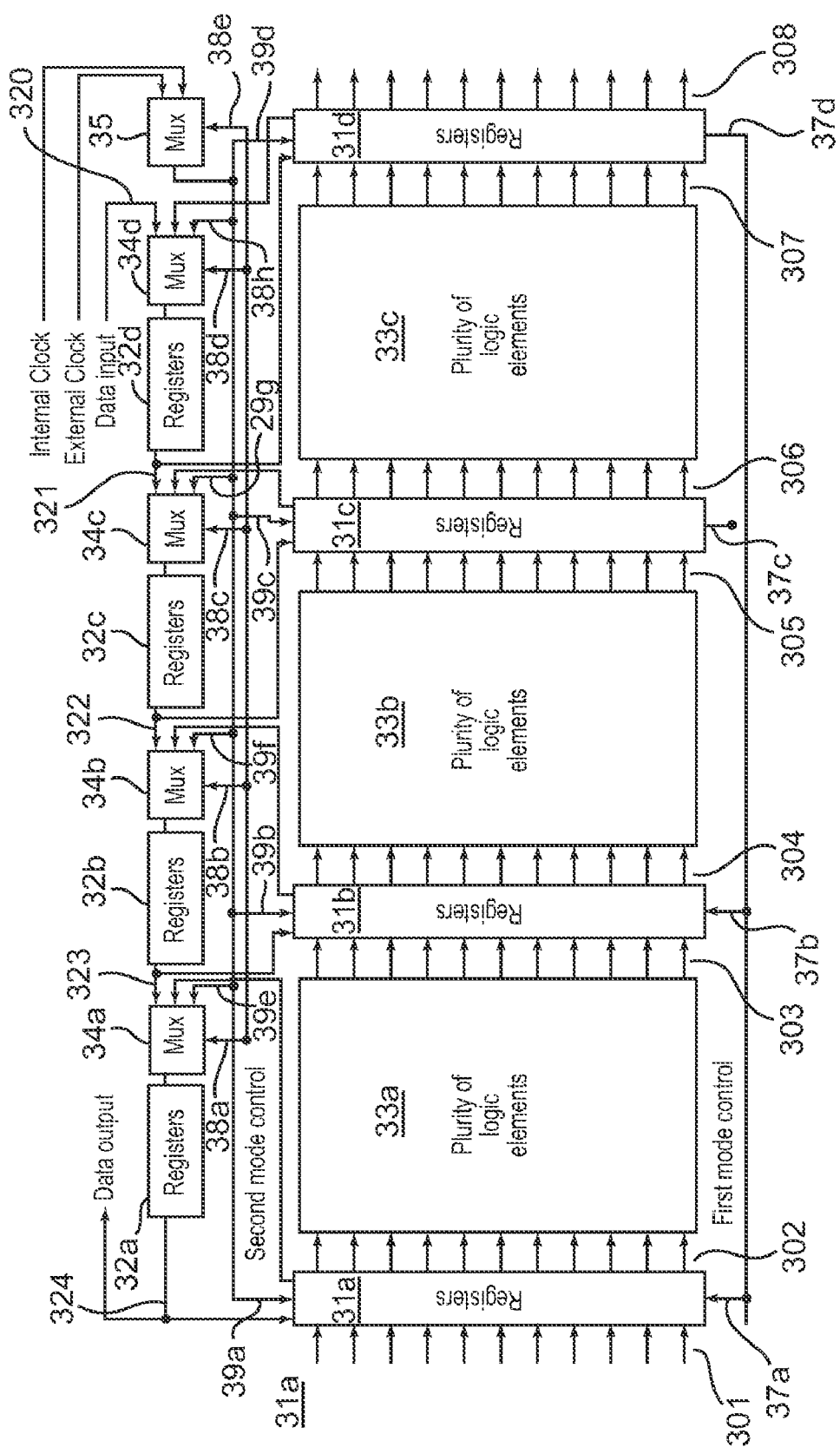
FIG. 3 illustrates an exemplary schematic diagram of a digital circuit according to a further embodiment.

FIG. 3 illustrates an exemplary schematic diagram of a digital circuit according to a further embodiment. The illustrated circuit includes a first plurality of storage elements 31a, a second plurality of storage elements 31b, a third plurality of storage elements 31c, a fourth plurality of storage elements 31d, a first plurality of logic elements 33a, a second plurality of logic elements 33b, and a third plurality of logic elements 33c. The first plurality of storage elements 31a may receive a plurality of input signals over connections 301 wherein each register of the first plurality of storage elements 31a receives one input signal.

The first plurality of storage elements 31a are connectable, via connections 302 to the first plurality of logic elements 33a which may receive the input signals from the first plurality of storage elements 31a, process the signals and forward the processed signals to the second plurality of storage elements 31b via connections 303. The second plurality of storage elements 31b may provide these signals over connections 304 to the second plurality of logic elements 33b which may process the received signals and forward the processed signals over connection 305 to the third plurality of storage elements 31c. The third plurality of storage elements 31c may provide these signals over connections 306 to the third plurality of logic elements 33c which may process the received signals and forward the processed signals over connection 307 to the fourth plurality of storage elements 31d. The fourth plurality of storage elements 31d may output the received signals over connection 308.

The circuit of FIG. 3 further includes a first further plurality of serially connected storage elements 32a, a second further plurality of serially connected storage elements 32b, a third further plurality of serially connected storage elements 31d, a fourth further plurality of serially connected storage elements 31d and a plurality or set of multiplexers 34a, 34b, 34c, 34d each of which is connected to a respective plurality of storage elements of the further pluralities of storage elements 32a, 32b, 32c, 32d.

In the illustrated embodiment, the storage elements of the pluralities of storage elements 31a, 31b, 31c, 31d and of the further pluralities of storage elements 32a, 32b, 32c, 32d are registers. However, the invention is not limited to registers, but storage elements of any type may be used. Further, the invention is not limited to a certain number of pluralities of (further) storage elements. A digital circuit according to the invention may include at least two, but also many more (further) pluralities of storage elements.

Additionally, a single multiplexer 35 is provided which receives two different clock signals, an internal clock and an external clock.

Similar to the circuit of FIG. 1b, also in the circuit of FIG. 3, the pluralities of registers 31a, 31b, 31c, 31d can be operated in two different operation modes, a first operation mode which is a "normal" operation mode and a second operation mode which is a test mode.

Accordingly, a first mode control signal is provided to each register of the pluralities of registers 31a, 31b, 31c, 31d via connections 37a, 37b, 37c, 37d to specify the operation mode for the pluralities of registers 31a, 31b, 31c, 31d. For example, the test mode may be represented by a "1" and the normal operation mode by a "0" comprised in the first mode control signal or vice versa, but other ways of indicating/controlling the operation mode are also possible.

In the normal operation mode, the pluralities of registers 31a, 31b, 31c, 31d operate according to their intended functionality within the digital circuit, whereas in the test mode, each of the first, second, third, and fourth pluralities of registers 31a, 31b, 31c, 31d is disconnected from the pluralities of logic elements 33a, 33b, 33c of the circuit and is connected to a corresponding one of the further pluralities of registers 32a, 32b, 32c, 32d.

Also the further pluralities of registers 32a, 32b, 32c, 32d can be operated in a first operation mode and a second operation mode.

Accordingly, a second mode control signal is provided to each of the further pluralities of registers 32a, 32b, 32c, 32d via connections 38a, 38b, 38c, 38d to specify the operation mode for the further pluralities of registers 32a, 32b, 32c, 32d. For example, the second operation mode may be represented by a "1" and the first operation mode by a "0" comprised in the second mode control signal or vice versa, but other ways of indicating/controlling the operation mode are also possible.

Additionally, the second control mode signal is further provided, via connection 38e, to the additional single multiplexer 35 to select one of the clocks, internal and external, respectively, at the inputs of the additional single multiplexer 35. The selected clock signal is provided to the pluralities of registers 31a, 31b, 31c, 31d via connections 39a, 39b, 39c, 39d and to the set of multiplexers 34a, 34b, 34c, 34d via connections 39e, 39f, 39g, 39h. The selected clock signal is the clock with which data may be transferred into the further pluralities of registers 32a, 32b, 32c, 32d. This may be a rather slow clock, if the respective data is stored externally to the circuit and has, for example, to be introduced via respective pads, or it may be a fast clock if the respective data is stored within the digital circuit.

In the beginning of a test of the digital circuit of FIG. 3, test data, for example, test vectors, are loaded into the further pluralities of registers 32a, 32b, 32c, 32d. For this purpose, the further pluralities of registers 32a, 32b, 32c, 32d or rather the set of multiplexers 34a, 34b, 34c, 34d are operated in the first operation mode (the second mode control signal includes, for example, a "0").

In the first operation mode, each of the set of multiplexers 34a, 34b, 34c, 34d forwards data received at its first input to its connected respective one of the further pluralities of registers 32a, 32b, 32c, 32d.

A first multiplexer 34d of the set of multiplexers 34a, 34b, 34c, 34d has its first input connected to a data input via connection 320 for receiving the test data or test vectors, respectively.

All other multiplexers of the set of multiplexers 34a, 34b, 34c, 34d have their first inputs connected to an output of a "proceeding" one of the further pluralities of registers 32a, 32b, 32c, 32d. In other words, the first input of multiplexer 34c is connected to the output of the fourth further plurality of registers 32d via connection 321, the first input of multiplexer 34b is connected to the output of the third further plurality of registers 32c via connection 322, and the first input of multiplexer 34a is connected to the output of the second further plurality of registers 32b via connection 323.

The first further plurality of registers 32a (which has its output not connected with a first input of a "succeeding" multiplexer) has its output connected with a scan data output via connection 324 for outputting data resulting from the test of the circuit.

Thus, when operating in the first operation mode, all registers of the further pluralities of registers 32a, 32b, 32c, 32d are sequentially connected to one scan chain, or, effectively, one long shift register, into which the test vectors are sequentially loaded, wherein the registers within each of the further pluralities of registers 32a, 32b, 32c, 32d are sequentially connected and also the further pluralities of registers 32a, 32b, 32c, 32d are sequentially connected to form the one long shift register.

During the process of loading the test vectors into the further pluralities of registers 32a, 32b, 32c, 32d the pluralities of registers 31a, 31b, 31c, 31d are operated in the normal operation mode and, therefore, normal operation of the digital circuit is not interrupted.

The above process of loading the test vectors having been completed, the set of multiplexers 34a, 34b, 34c, 34d connected to the further pluralities of registers 32a, 32b, 32c, 32d receive an appropriate second modus control signal (for example, "1") causing them to switch to the second operation mode. Also the pluralities of registers switch to the test mode having received an appropriate first modus control signal (for example, "1").

In the second operation mode, each of the set of multiplexers 34a, 34b, 34c, 34d forwards data received at its second input to its connected one of the further pluralities of registers 32a, 32b, 32c, 32d.

In the test mode, each of the pluralities of registers 31a, 31b, 31c, 31d is disconnected from the pluralities of logic elements 33a, 33b, 33c of the circuit and connected to a corresponding one of the further pluralities of registers 32a, 32b, 32c, 32d.

For a better understanding of further operation of the circuit, one pair of pluralities of registers consisting of the fourth plurality of registers 31d and the fourth further plurality of registers 32d are considered in the following.

In this exemplary pair of pluralities of registers, an output of the fourth plurality of registers 31d is connected with an input of the fourth further plurality of registers 32d via multiplexer 24d and an output of the fourth further plurality of registers 32d is connected to an input of the fourth plurality of registers 31d which allows an exchange of data contents buffered in each register of the pluralities of registers 31d and 32d.

Accordingly, the test vectors are transferred from of each register of the fourth further plurality of registers 32d to the respective registers of the fourth plurality of registers 31d and the former content of the registers of the fourth plurality of registers 31d is transferred to the respective registers of the fourth further plurality of registers 32d.

In this process, the contents of the respective registers are sequentially transferred, wherein the content of one register is transferred per clock which is a fast internal clock. This data exchange may be considered as a data exchange between two first-in, first-out (FIFO) registers. Thus, after as many cycles as number of registers in the fourth (further) pluralities of registers is the contents of the fourth plurality of registers 31d and the fourth further plurality of registers 32d will be completely exchanged, that is, the fourth plurality of registers 31d includes the former contents of the fourth further plurality of registers 32d and vice versa.

In the other pairs of pluralities of registers which also respectively include one of the pluralities of registers 31a, 31b, 31c and a corresponding one of the further pluralities of registers 32a, 32b, 32c data transfer takes place in an analogous way. These data transfers can be carried out in parallel with the fast internal clock reducing the time required for loading the test vectors into the pluralities of registers 31a, 31b, 31c, 31d significantly. Accordingly, one long scan chain is split into several shorter partial scan chains which are processed in parallel. Considering, for example, 96 registers which are connected to four partial scan chains, then, only about 49 clocks are required for the scan test: 24 clocks for shifting the test vectors into the pluralities of registers, about one clock for propagating the test vectors through the pluralities of logic elements, and 24 for shifting the result vectors (the processed test vectors) out of the pluralities of registers.

Further, the actual state of the circuit is preserved in the further pluralities of registers 32a, 32b, 32c, 32d and shifted back into the pluralities of registers 31a, 31b, 31c, 31d to reestablish the former state of the digital after the scan test.

By contrast, in conventional systems as illustrated in FIG. 1b, the actual state of the system is lost, when loading the test vectors into the registers and the process of loading requires significantly more time since the test vectors are loaded sequentially into the registers with a rather slow external clock.

Then, the pluralities of registers 31a, 31b, 31c, 31d are caused to switch to the first operation mode by an appropriate first mode control signal (for example, "0") to let the test vectors propagate through the pluralities of logic elements for at least one clock.

Thereupon, the pluralities of registers 31a, 31b, 31c, 31d are caused to switch back to the second operation mode by an appropriate first mode control signal (for example, "1") to allow a reexchange of data between respective pairs of the pluralities of registers 31a, 31b, 31c, 31d and the further pluralities of registers 32a, 32b, 32c, 32d, that is, the processed test vectors are transferred from the pluralities of registers 31a, 31b, 31c, 31d to the further pluralities of registers 32a, 32b, 32c, 32d and the data contents of the further pluralities of registers 32a, 32b, 32c, 32d are transferred to the pluralities of registers 31a, 31b, 31c, 31d to reestablish the state in which the circuit was before the test.

Thereafter, the pluralities of registers 31a, 31b, 31c, 31d are caused to switch back to the normal operation mode by an appropriate first mode control signal (for example, "0") to allow continuing normal operation of the circuit.

At the same time, the set of multiplexers 34a, 34b, 34c, 34d connected to the further pluralities of registers 32a, 32b, 32c, 32d receive an appropriate second mode control signal (for example, "0") causing them to switch to the first operation mode. In the first operation mode, the first inputs of the multiplexers are activated, so that all registers from the further pluralities of registers 32a, 32b, 32c, 32d form effectively one shift register, wherein the registers within each of the further pluralities of registers 32a, 32b, 32c, 32d are sequentially connected and also the further pluralities of registers 32a, 32b, 32c, 32d are sequentially connected to form the long shift register. From this long shift register the test results, that is, the processed test vectors, are sequentially output to the scan output.

Figure 4:
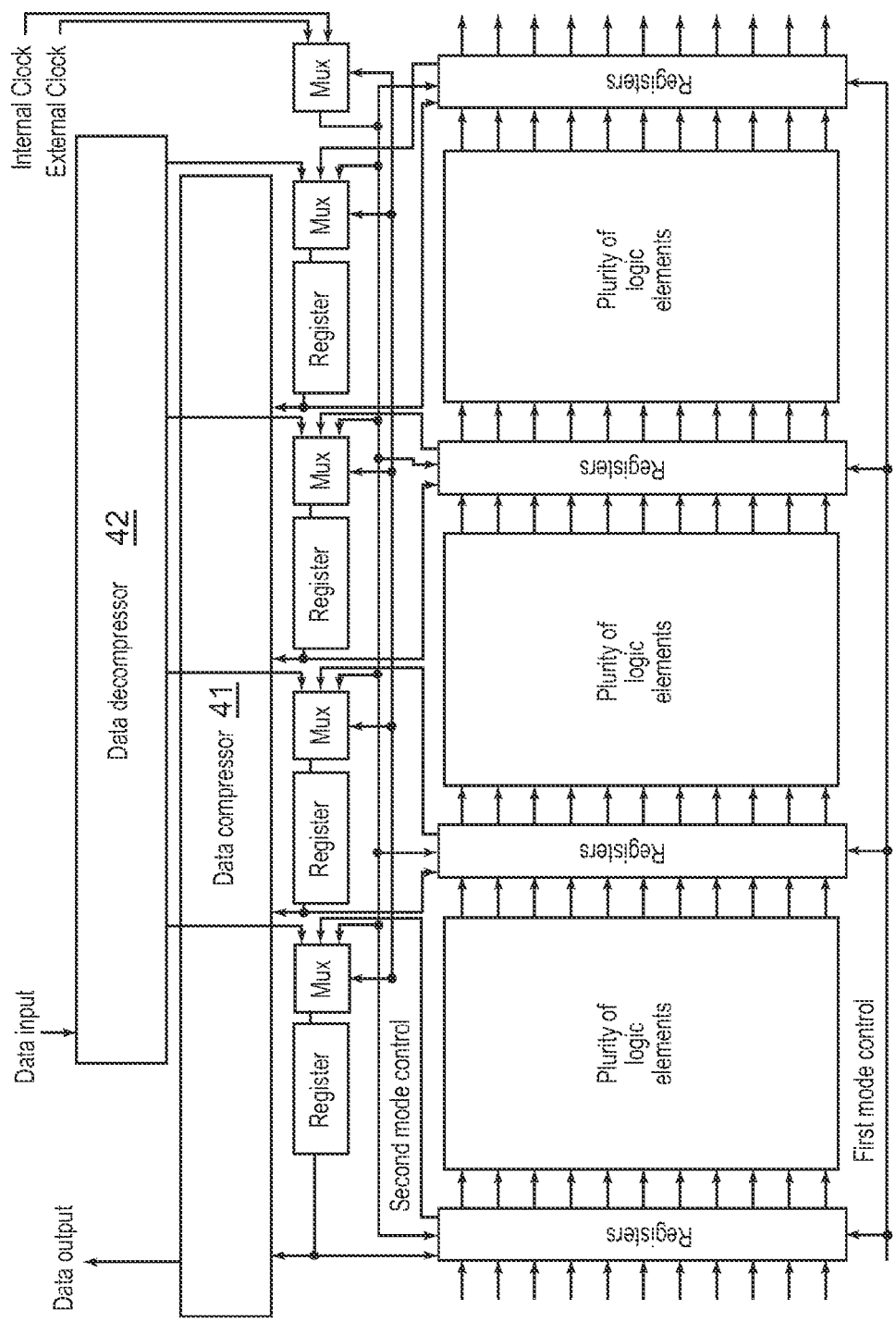
FIG. 4 illustrates an exemplary schematic diagram of a digital circuit according to a further embodiment.

FIG. 4 illustrates an exemplary schematic diagram of a digital circuit according to a further embodiment. The circuit of FIG. 4 is based on the circuit of FIG. 3 but also includes in addition to the elements of the circuit of FIG. 3 a data compressor 41 and a data decompressor 42 for reducing the amount of data which has to be introduced from outside the digital circuit to be tested. As for the circuits to be tested a manageable amount of errors is to be expected the initial test vector may be compressed by polynomial division which is a lossy compression method, however. This means in this context that there is a certain probability that multiple errors may cancel each other out. However, as a complete test includes 100-1000 different test vectors it is to be expected that one error of the multiple errors will be tested again. Therefore, data compression by polynomial division may be carried out to significantly reduce the amount of data to be introduced from outside the digital circuit and to be scrutinized externally after the scan test. In digital circuit technology this kind of data compression is usually implemented by linear shift feedback registers (LSFR).

For generating test vectors suitable for a scan test of a digital circuit commercial software tools may be used.

Figure 5:
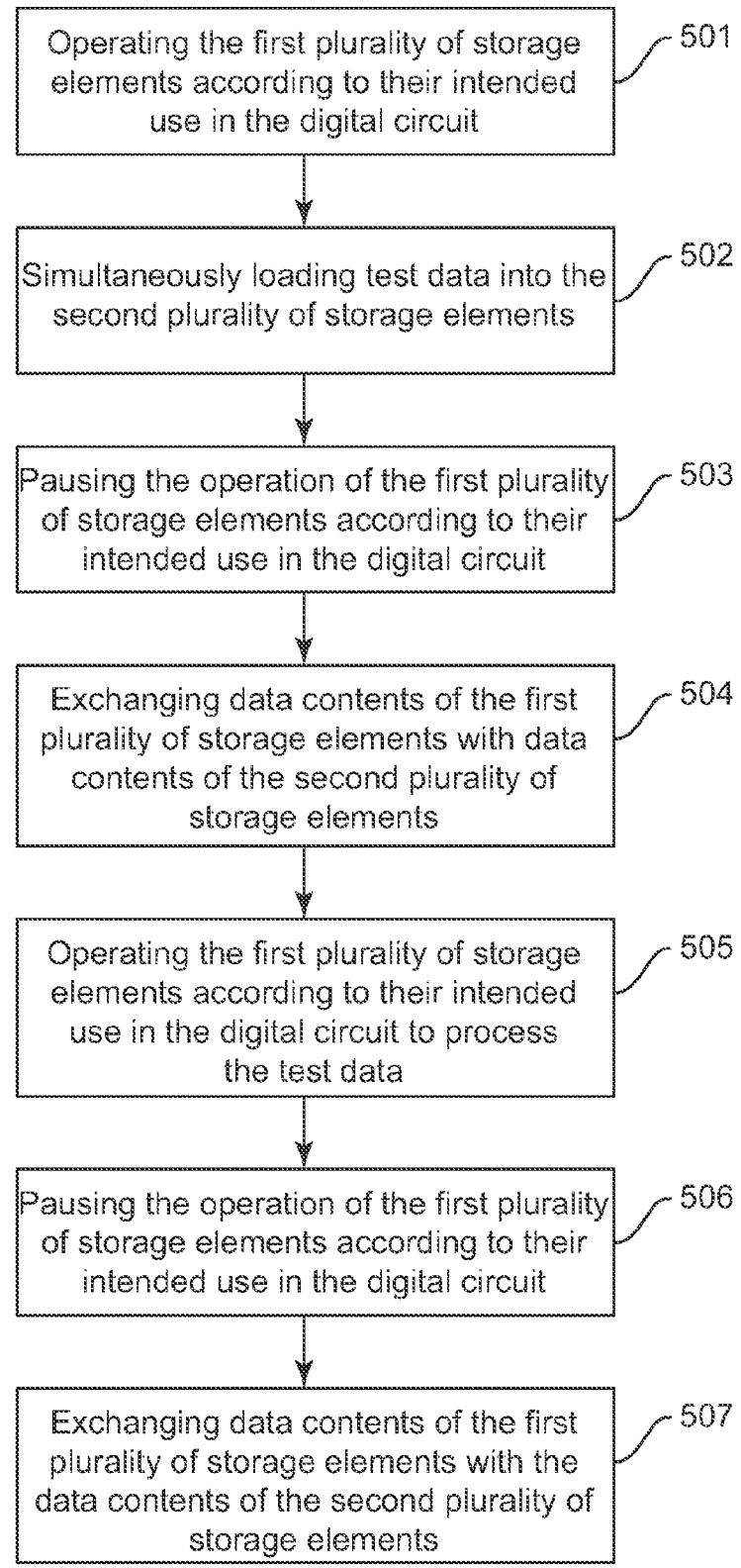
FIG. 5 illustrates a schematic simplified flowchart illustrating a method for testing a digital circuit in accordance with a further embodiment.

FIG. 5 illustrates a schematic simplified flowchart illustrating a method for testing a digital circuit in accordance with a further embodiment of the invention.

In process 501, the first plurality of storage elements are operated according to their intended use in the digital circuit and, simultaneously, in process 502, test data are loaded into the second plurality of storage elements.

Then, the operation of the first plurality of storage elements according to their intended use in the digital circuit is paused in process 503. In the meantime, in process 504, data contents of the first plurality of storage elements are exchanged with data contents of the second plurality of storage elements.

Having finished the data exchange of process 504 the first plurality of storage elements are operated according to their intended use in the digital circuit to process the test data in process 505.

Then, in process 506, the operation of the first plurality of storage elements according to their intended use in the digital circuit is paused again and the data contents of the first plurality of storage elements are exchanged with the data contents of the second plurality of storage elements in process 507.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A digital circuit comprising:
a first plurality of storage elements; and
a second plurality of storage elements;
the digital circuit being operable in a first operation mode and in a second operation mode;
wherein, in the first operation mode, the storage elements of the second plurality of storage elements are connected in series to receive and store test data and are disconnected from the storage elements of the first plurality of storage elements, and wherein the first plurality of storage elements receive and transfer signal data within the digital circuit, and wherein, in the second operation mode, each storage element of the first plurality of storage elements is connected with a corresponding storage element of the second plurality of storage elements, such that each of the second plurality of storage elements is adapted to transmit the test data stored in a respective storage element of the second plurality of storage elements to the corresponding storage element of the first plurality of storage elements, and each of the first plurality of storage elements is adapted to transmit the signal data stored in a respective storage element of the first plurality of storage elements to the corresponding storage element of the second plurality of storage elements.

2. The digital circuit of claim 1, further comprising:
a data input; and
a data output;
wherein, in the first operation mode, one storage element of the second plurality of storage elements is connected to the data input and a further storage element of the second plurality of storage elements is connected to the data output.

3. The digital circuit of claim 2, wherein, in the first operation mode, test data is sequentially loaded into storage elements of the second plurality of storage elements via the data input.

4. The digital circuit of claim 1 further comprising a data compressor and a data decompressor.

5. An integrated circuit comprising:
a first plurality of storage elements;
a second plurality of storage elements;
a third plurality of storage elements; and
a fourth plurality of storage elements;
the integrated circuit being operable in a first operation mode and in a second operation mode;
wherein in the first operation mode, the first plurality of storage elements and the second plurality of storage elements receive and transfer signal data within the integrated circuit, and wherein the third plurality of storage elements and the fourth plurality of storage elements are connected in series with one another and receive and store test data while being disconnected from the first and second pluralities of storage elements,
wherein in the second operation mode, each storage element of the first plurality of storage elements is connected to a corresponding storage element of the third plurality of storage elements such that each of the third plurality of storage elements is adapted to transmit the test data stored in a respective storage element of the third plurality of storage elements to the corresponding storage element of the first plurality of storage elements, and each of the first plurality of storage elements is adapted to transmit the signal data stored in a respective storage element of the first plurality of storage elements to the corresponding storage element of the third plurality of storage elements, and each storage element of the second plurality of storage elements is connected to a corresponding storage element of the fourth plurality of storage elements such that each of the fourth plurality of storage elements is adapted to transmit the test data stored in a respective storage element of the fourth plurality of storage elements to the corresponding storage element of the second plurality of storage elements, and each of the second plurality of storage elements is adapted to transmit the signal data stored, in a respective storage element of the second plurality of storage elements to the corresponding storage element of the fourth plurality of storage elements.

6. The integrated circuit of claim 5, further comprising:
a data input; and
a data output;
wherein, in the first operation mode, one storage element of the third plurality of storage elements is connected to the data input and one storage element of the fourth plurality of storage elements is connected to the data output such that all storage elements of the third plurality and fourth plurality of storage elements are connected in series between the data input and the data output.

7. The integrated circuit of claim 6, wherein, in the first operation mode, test data is sequentially loaded into storage elements of the third and the fourth plurality of storage elements via the data input.

8. The digital circuit of claim 5 further comprising a data compressor and a data decompressor.

9. A method for testing a digital circuit comprising:
operating a first plurality of storage elements for receiving and transferring signal data within the digital circuit while simultaneously loading and storing test data into a second plurality of storage elements;
pausing the receiving and transferring of signal data by the first plurality of storage elements;
connecting each storage element of the first plurality of storage elements with a corresponding storage element of the second plurality of storage elements, such that each of the second plurality of storage elements transmits the test data stored in a respective storage element of the second plurality of storage elements to the corresponding storage element of the first plurality of storage elements, and each of the first plurality of storage elements transmits the signal data stored in a respective storage element of the first plurality of storage elements to the corresponding storage element of the second plurality of storage elements; and
operating the first plurality of storage elements with test data as the signal data within the digital circuit to process the test data.

10. The method of claim 9 further comprising:
pausing again the receiving and transferring of signal data by the first plurality of storage elements within the digital circuit; and
connecting each storage element of the first plurality of storage elements with the corresponding storage element of the second plurality of storage elements such that each of the second plurality of storage elements transmits the previously transferred signal data stored in a respective storage element of the second plurality of storage elements to the corresponding storage element of the first plurality of storage elements, and each of the first plurality of storage elements transmits the processed test data stored in a respective storage element of the first plurality of storage elements to the corresponding storage element of the second plurality of storage elements.

11. A method for testing a digital circuit comprising:
providing a first operation mode in which test data is loaded into and stored in a second plurality of storage elements while a first plurality of storage elements receives and transfers signal data within the digital circuit; and
further providing a second operation mode, in which each storage element of the first plurality of storage elements is connected with a corresponding storage element of the second, plurality of storage elements, such that each of the second plurality of storage elements transmits the test data stored in a respective storage element of the second plurality of storage elements to the corresponding storage element of the first plurality of storage elements, and each of the first plurality of storage elements transmits the signal data stored in a respective storage element of the first plurality of storage elements to the corresponding storage element of the second plurality of storage elements.

12. The method of claim 11, wherein in the signal data contents of the first plurality of storage elements represents a state of the digital circuit.

* * * * *